United States Patent
Lu et al.

(10) Patent No.: US 7,577,321 B2
(45) Date of Patent: Aug. 18, 2009

(54) HYBRID ELECTRO-OPTICAL CIRCUIT BOARD AND METHOD FOR FABRICATING THE SAME

(75) Inventors: Chien-Chun Lu, Hsinchu (TW);
Shin-Ge Lee, Hsinchu (TW);
Chun-Hsing Lee, Hsinchu (TW);
Shun-Tien Lee, Hsinchu (TW);
Ying-Chih Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/790,547

(22) Filed: Apr. 26, 2007

(65) Prior Publication Data

US 2008/0138006 A1 Jun. 12, 2008

(30) Foreign Application Priority Data

Dec. 6, 2006 (TW) .............................. 95145496 A

(51) Int. Cl.
*G02B 6/12* (2006.01)

(52) U.S. Cl. .............................. 385/14; 385/31; 385/39; 385/47; 385/50

(58) Field of Classification Search .................. 385/14, 385/31, 39, 47, 50
See application file for complete search history.

(56) References Cited

U.S. PATENT DOCUMENTS

| | | | |
|---|---|---|---|
| 6,330,377 B1 * | 12/2001 | Kosemura | 385/14 |
| 6,512,861 B2 * | 1/2003 | Chakravorty et al. | 385/14 |

FOREIGN PATENT DOCUMENTS

WO  WO-2006059510  6/2006

* cited by examiner

*Primary Examiner*—Frank G Font
*Assistant Examiner*—Michael P Mooney
(74) *Attorney, Agent, or Firm*—Rabin & Berdo, P.C.

(57) ABSTRACT

A hybrid electro-optical circuit board including a plate, a light guiding hole and a light-guide device. The light guiding hole is formed in the plate to be connected to an upper surface and a lower surface of the plate. The light-guide device is formed on the lower surface and covers and contacts the light guiding hole. An optical signal is transmitted between the light-guide device and the upper surface of the plate via the light guiding hole. A metal layer is further formed on an inner wall of the light guiding hole, to reduce the roughness of the inner wall and reflects the optical signal by the reflection characteristics of metal. Further, the light guiding hole is filled with a transparent substance to transmit the optical signal and to stop foreign material from entering the light guiding hole.

16 Claims, 8 Drawing Sheets

HYBRID ELECTRO-OPTICAL CIRCUIT BOARD AND METHOD FOR FABRICATING THE SAME

CROSS-REFERENCE TO RELATED APPLICATIONS

This non-provisional application claims priority under 35 U.S.C. § 119(a) on Patent Application No(s). 095145496 filed in Taiwan, R.O.C. on Dec. 6, 2006, the entire contents of which are hereby incorporated by reference.

BACKGROUND OF THE INVENTION

1. Field of Invention

The present invention relates to transmission of an optical signal, in particular to a hybrid electro-optical circuit board that integrates a light-guide device with an electro-optical element.

2. Related Art

Most of the high-speed electronic communication systems perform electrical signal transmission using metal wires. In order to enhance the communication bandwidth, the frequency of the electrical signal has been significantly enhanced. However, the electrical signal running at a high frequency results in severe electromagnetic interference. In order to reduce the electromagnetic interference, the transmission bandwidth and frequency of the electrical signal are limited, thus it is difficult to further increase the data transfer rate in the electrical signal transmission. During the optical signal transmission, neither electromagnetic wave leakage, nor suffered from the interference of the outer electromagnetic wave is caused, and thus being gradually integrated into the electrical circuit, to serve as a channel for signal transmission.

In the current optical signal transmission, an optical fiber is used to transmit an optical signal, and the optical fiber is connected to an electro-optical element through a coupler, so as to convert the optical signal into an electrical signal to be transmitted to other electronic elements. The current approach is to integrate a light-guide device with an electro-optical element onto a circuit board to form a hybrid electro-optical circuit board, for example, as disclosed in U.S. Pat. No. 6,512,861, an electro-optical element for converting an optical signal to an electrical signal is disposed on the upper surface of a plate, and a light-guide device is formed on the lower surface of the plate, and covers a light guiding hole of the plate, so that the optical signal is transmitted between the electro-optical element and an optical waveguide element via the light guiding hole.

However, the above design has disadvantages. Generally, a printed circuit board serving as the plate is formed with resin-glass fibers and metal circuits. In the subsequent process for fabricating the circuit board, chemical substances have to be used for removing the adhesive glue residuals from the light guiding hole, and for etching for the metal circuits, or adhesive glue is required for laminating the elements or multi-layer boards. As a result, during the above two processes, the chemical substances or the adhesive glue enter the light guiding hole. The chemical substances, such as strong bases, for example, potassium hydroxide (KOH), or strong acids, corrode the inner wall of the light guiding hole, such as to roughen the inner wall of the light guiding hole. Therefore, the reflection efficiency of the inner wall of the light guiding hole to the optical signal is degraded, such that the intensity of the optical signal rapidly decays after passing through the light guiding hole. On the other aspect, the adhesive glue fills the light guiding hole, and blocks the traveling path of the optical signal, thus directly affecting the yield of the manufacturing process. Therefore, how to ensure the light guiding hole not to be damaged during the manufacturing process becomes a problem to be solved.

SUMMARY OF THE INVENTION

As for the hybrid electro-optical circuit board in the prior art, the problem that the light guiding hole is damaged during the fabricating process has not been solved yet. In view of the above problem, the present invention provides a hybrid electro-optical circuit board and a method for fabricating the same, which are capable of avoiding the damage to the light guiding hole, and maintaining the intensity of the optical signal transmitted.

The hybrid electro-optical circuit board of the present invention includes a plate, a light-guide device, a metal layer, and a transparent substance. The plate has a light guiding hole, which is formed in the plate, for connecting an upper surface and a lower surface of the plate. The light-guide device is formed on the lower surface of the plate, and covers and contacts with the light guiding hole, so as to transmit an optical signal from or to the upper surface of the plate via the light guiding hole. The metal layer is formed on an inner wall of the light guiding hole. The metal layer reduces the roughness of the inner wall of the light guiding hole, and reflects the optical signal by the reflection characteristics of metal, so as to minimize the decay of the intensity of the optical signal due to being reflected for too many times or being absorbed by the rough inner wall of the light guiding hole. The transparent substance fills the light guiding hole, to transmit the optical signal, so as to avoid foreign materials, for example, a chemical agent, or adhesive glue, from entering the light guiding hole during the manufacturing process.

The present invention provides a method for fabricating a hybrid electro-optical circuit board. According to the method, first provide a plate. Then form at least one light guiding hole on the plate. The light guiding hole is connected to an upper surface and a lower surface of the plate. Form a metal layer on an inner wall of the light guiding hole, to reduce the roughness of the inner wall of the light guiding hole, and reflect an optical signal by the reflection characteristics of metal, so as to minimize the decay of the intensity of the optical signal due to being reflected for too many times or absorbed by the rough inner wall of the light guiding hole. Then fill the light guiding hole with a transparent substance, to transmit the optical signal. Finally, Form a light-guide device on the lower surface of the plate, wherein the light-guide device covers and contacts with the light guiding hole, and transmits the optical signal form or to the upper surface of the plate via the light guiding hole.

Through the present invention, the roughness of the inner wall of the light guiding hole is effectively reduced, and the reflection efficiency of the optical signal is increased by the reflection characteristics of metal, and thus the optical signal passing through the light guiding hole will not decay rapidly. Furthermore, by way of filling the light guiding hole with a transparent substance, a chemical agent and adhesive glue used in the manufacturing process are prevented from entering the light guiding hole, so that the light guiding hole is effectively prevented from being damaged or blocked, thus the overall fabricating yield is improved, and the difficulty and cost for fabricating the hybrid electro-optical circuit board are reduced.

Further scope of applicability of the present invention will become apparent from the detailed description given herein-after. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

To make the objectives, structures, features, and functions of the present invention be more comprehensible, the present invention is illustrated below in great detail through the embodiments.

Figure 1:
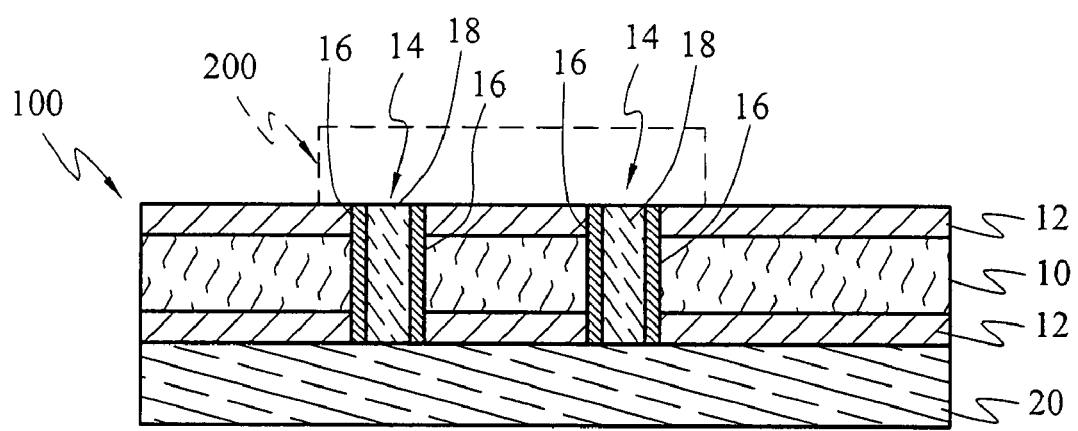
FIG. 1 is a cross-sectional view of a hybrid electro-optical circuit board according to a first embodiment of the present invention.

FIG. 1 is a cross-sectional view of a hybrid electro-optical circuit board 100 according to a first embodiment of the present invention. Referring to FIG. 1, the hybrid electro-optical circuit board includes a plate 10 and a light-guide device 20. An optical signal is transmitted to an electro-optical element 200 disposed on the hybrid electro-optical circuit board 100 by the light-guide device 20.

Referring to FIG. 1 again, the plate 10 can be a printed circuit board or a flexible circuit board, for the electro-optical element 200 or an electronic element (not shown) to be mounted thereon. The size and configuration of the plate 10 are pre-cut and pre-formed according to the size required of the hybrid electro-optical circuit board 100. The plate 10 has two conductor layers 12 respectively formed on an upper surface and a lower surface of the plate 10. The fabrication method for each conductor layer 12 is determined based upon the requirements of the circuit of the inner layer, which particularly includes the following steps. First, coat a copper foil or film on the upper and lower surfaces of the plate 10, and then, perform the developing and etching process, so as to form the conductor layer 12 having circuits of the inner layer. The conductor layer 12 is used to connect with the electro-optical element 200, so as to transmit an electrical signal. Moreover, the number of the conductor layer 12 also can be one, which is formed on the upper surface of the plate 10.

The plate 10' also has a plurality of light guiding holes 14, and each light guiding hole 14 is formed in the plate 10 and penetrates through the plate 10 for connecting the upper surface and the lower surface of the plate 10. Each light guiding hole 14 is provided for the optical signal to be transmitted between the upper and lower surfaces of the plate 10. A metal layer 16 is formed on an inner wall of the light guiding hole 14 by electroplating, in which the material of the metal layer 16 is a metal with a high reflective coefficient, such as gold, tin, silver, copper, aluminum, and the alloy thereof. The metal layer 14 is provided for reducing the roughness of the inner wall of each light guiding hole 14, and reflects the optical signal by reflection characteristics of the metal, so as to minimize the decay rate of the intensity of the optical signal due to being reflected for too many times or absorbed by the rough structure formed upon the inner wall of the light guiding hole 14 when drilling the light guiding hole 14.

Furthermore, a transparent substance 18 fills the light guiding hole 14 to fully fill the whole light guiding hole 14, and the optical signal can be transmitted there-through. The transparent substance 18 is provided for transmitting the optical signal and resisting the corrosion caused by chemical agents. In other words, the transparent substance 18 is an anti-chemical corrosion material. Since the light guiding hole 14 is fully filled with the transparent substance 18, a chemical agent or adhesive glue used in the subsequent process are prevented from entering the light guiding hole 14 and thereby an undesired impact on the reflection conditions for the inner wall of the light guiding hole 14 is eliminated. The transparent substance is selected from inorganic material, an organic material, or organic-inorganic mixed material. The inorganic material comprises glasses fiber, and the organic material comprises polyimide (PI), polycarbonate (PC), silica gel, or any combination thereof. The organic-inorganic mixed material is a mixture of organic materials with silicates, and the above organic materials mixed with silicates comprise polymers, for example, PI, PC, and silica gel.

Referring to FIG. 1 again, the light-guide device 20 is formed on the lower surface of the plate 10, for transmitting the optical signal. The conductor layer 12 on the lower surface of the plate 10 is located between the plate 10 and the light-guide device 20. The light-guide device 20 covers and contacts with the light guiding hole 14, such that the light-guide device 20 transmits the optical signal from or to the upper surface of the plate 10 via the light guiding hole 14. Moreover, the electro-optical element 200 or an electronic element is disposed on the upper surface of the plate 10, and covers the light guiding hole 14, so that the electro-optical element 200 can receives and transmits the optical signal by way of being coupled to the light-guide device 20 through the light guiding hole 14. The foregoing description is a single hybrid electro-optical circuit board structure 100 having a light-guide device 20 in a multi-layer board structure, and the fabricating method thereof is illustrated below.

Referring to FIGS. 2A to 2D, the fabricating method for a hybrid electro-optical circuit board is illustrated, which includes the following steps.

Figure 2A:
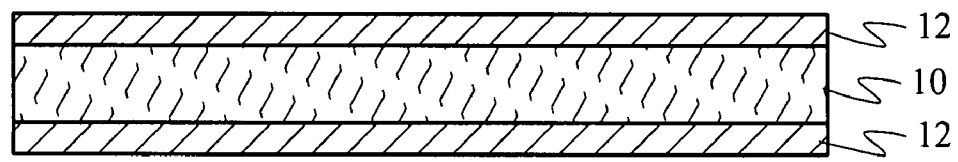
FIGS. 2A, 2B, 2C, 2D, 2E, and 2F are schematic flow charts of a fabricating method according to the first embodiment of the present invention.

According to the requirement of size, a rigid circuit board or a flexible circuit board is cut to provide a plate 10. Through an inner plating process, form at least one conductor layer 12 on the upper surface of the plate for transmitting electrical signal. The method for forming the conductor layer 12 is attaching a copper foil or an aluminum foil on the plate 10, or plating a copper film on the plate, and then etching the copper foil, aluminum foil, or copper film to form a conductor layer 12 composed of inner layer circuits on the upper and lower surfaces of the plate 10, as shown in FIG. 2A. The conductor layer 12 is used to transmit the electrical signal.

Figure 2B:
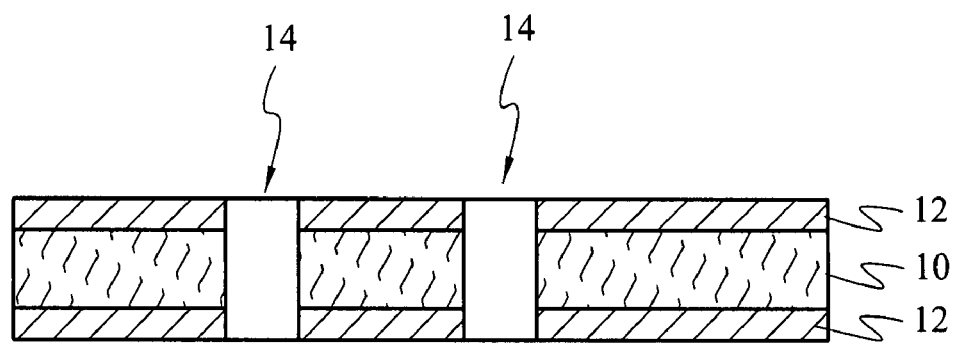

Then, form a plurality of light guiding holes 14 on the plate 10 through laser or mechanical drilling processes. The number of the light guiding holes 14 is determined depending on the requirements of transmission of the optical signal, and in this embodiment, there are two light guiding holes 14. The light guiding hole 14 penetrates through the plate 10, and thus is connected to the upper and lower surfaces of the plate 10, to transmit the optical signal between the upper and lower surfaces of the plate 10, as shown in FIG. 2B.

Figure 2C:
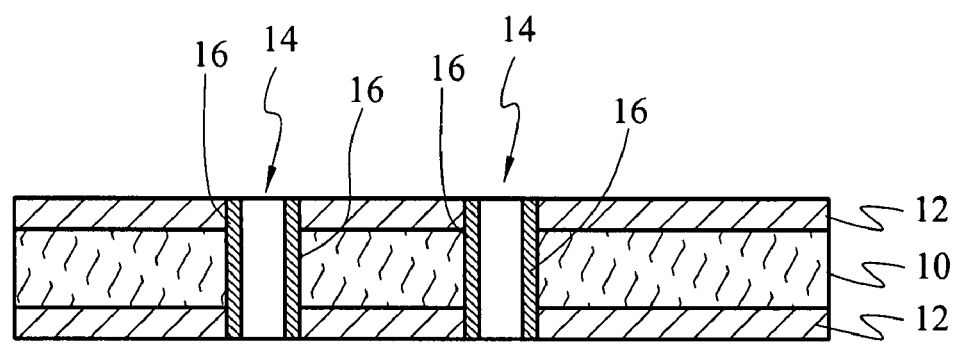

Next, a metal layer 16 is formed on an inner wall of each light guiding hole 14, and covers the inner wall of the whole light guiding hole 14, as shown in FIG. 2C. After the thickness of the metal layer 16 has gradually increased, the metal layer 16 can reduce the surface roughness of the inner wall of the light guiding hole 14. Meanwhile, the metal layer 16 can reflect the optical signal by reflection characteristics of the metal, so as to reduce the decay of intensity of the optical signal due to being reflected for too many times or absorbed by the rough inner wall of the light guiding hole 14. The material of the metal layer 16 is selected to be a metal with a high reflective coefficient depending on the wavelength of the optical signal, and the metal layer 16 is coated on the inner wall of the light guiding hole 14 in a manner of electroplating or electroless plating, to increase the optical signal reflectivity of the inner wall of the light guiding hole 14, and to reduce the decay of intensity of the optical signal when passing through the light guiding hole 14. Taking the optical signal of 850 nm wavelength as an example, the material of the metal layer 16 can be selected from gold, tin, silver, copper, or aluminum. Under the circumstance that the optical signal of 850 nm, the reflection efficiency of gold is about 99%, and the reflection efficiency of silver is about 97%, and the reflection efficiency of aluminum is 91%.

Figure 2D:
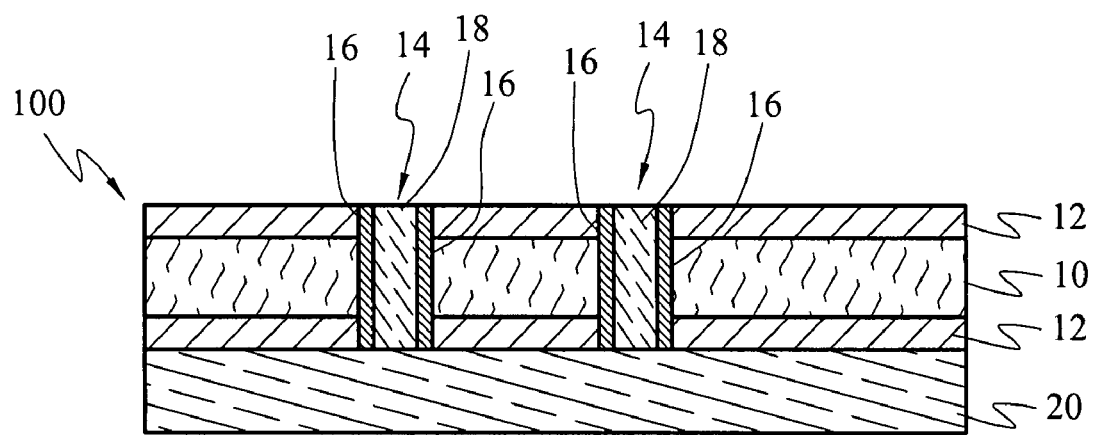

Subsequently, the light guiding hole 14 is fully filled with a transparent substance 18, as shown in FIG. 2D. The transparent substance 18 can resist the corrosion of chemical agents and transmit the optical signal. The transparent substance 18 is selected depending upon the chemical agent used in the subsequent process, so that the transparent substance 18 filling the light guiding hole 14 can resist the corrosion of chemical agents. The transparent substance 18 is selected from inorganic material, organic material, or organic-inorganic mixed material, which is transmitted through by the optical signal, and can resist the corrosion of chemical agents, such as, chromic acid, sulfuric acid, or potassium permanganate. Since the light guiding hole 14 is fully filled with the transparent substance 18, theses chemical agents are prevented from entering the light guiding hole 14, the corrosion of the metal layer 16 or the inner wall of the light guiding hole 14 is prevented, and the adhesive glue is also prevented from entering the light guiding hole 14 to blocking the optical signal.

Finally, a light-guide device 20 is formed on the lower surface of the plate 10, and covers and contacts with the light guiding hole 14. The optical signal is transmitted between the light-guide device 20 and the upper surface of the plate 10 via the light guiding hole 14. The light-guide device 20 can be fabricated by a photolithographic process, a laser writing process, or a pressing process, so that the light-guide device 20 composed of optical waveguide material is formed on one side of the plate 10.

Figure 2E:
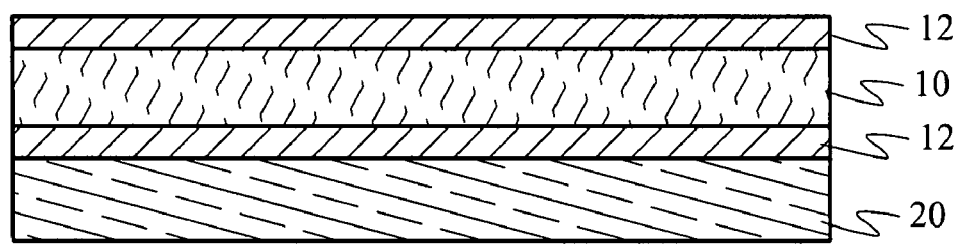
Figure 2F:
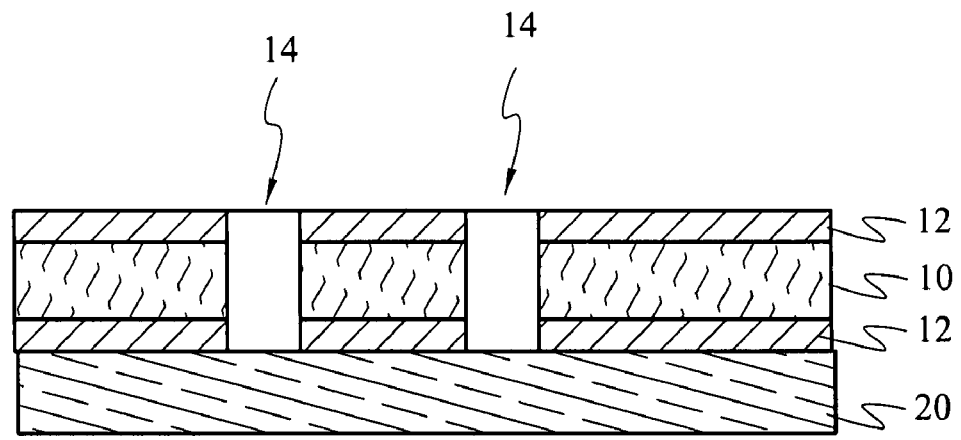

The fabrication procedure is not limited to the above-described sequence. For example, the conductor layer 12 and the light-guide device 20 can be firstly formed on the plate 10, then, the light guiding hole 14 is formed, after that, the metal layer 16 is formed, and the transparent substance 18 finally fills the light guiding hole 14, as shown in FIGS. 2E and 2F. Alternatively, the light guiding hole 14 is formed in the plate 10, then, the transparent substance 18 fills the light guiding hole 14, and after those steps, the subsequent processes are carried out, where the light guiding hole 14 is protected by the transparent substance 18 at the very beginning of the subsequent process.

The above description is directed to a single hybrid electro-optical circuit board structure 100 having light-guide device in a multi-layer board structure, and the hybrid electro-optical circuit board having a multi-layer substrate structure will be further illustrated below.

Figure 3:
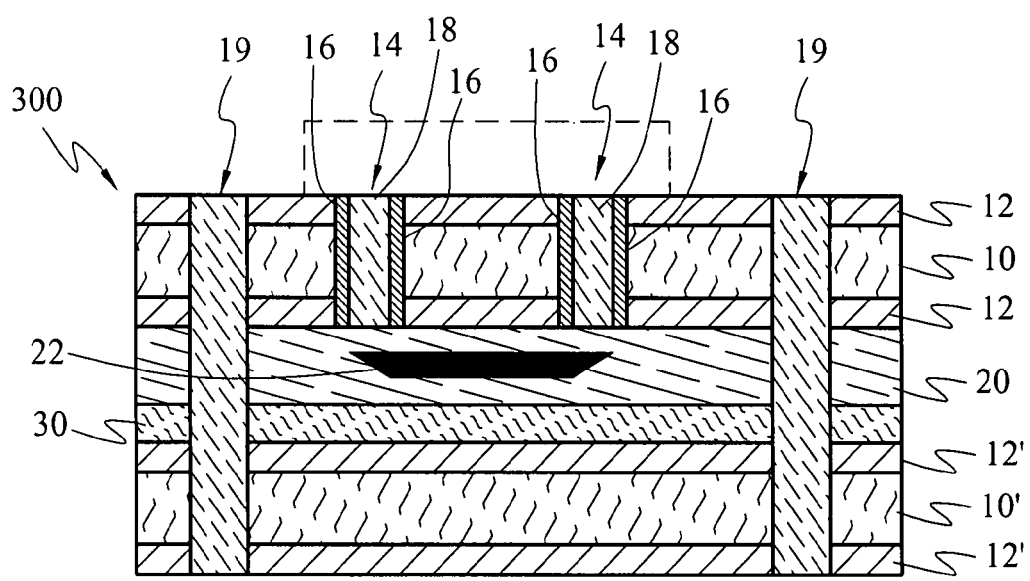
FIG. 3 is a cross-sectional view of a hybrid electro-optical circuit board according to a second embodiment of the present invention.

Referring to FIG. 3, a hybrid electro-optical circuit board 300 of a multi-layer board structure according to the second embodiment of the present invention includes a plate 10, an auxiliary plate 10', and a light-guide device 20. The plate 10 has two conductor layers 12 formed on the upper and lower surfaces of the plate 10 respectively. Moreover, the plate 10 has a plurality of light guiding holes 14, and each light guiding hole 14 penetrates through the plate 10, thereby connecting the upper and lower surfaces of the plate 10. A metal layer 16 is formed on the inner wall of each light guiding hole 14, and a transparent substance 18 further fills the light guiding hole 14, to fully fill the light guiding hole 14.

Referring to FIG. 3 again, the light-guide device 20 is formed on the lower surface of the plate 10, and covers and contacts with the light guiding hole 14, so that the optical signal is transmitted through the transparent substance 18, and transmitted between the light-guide device 20 and the upper surface of the plate 10 via the light guiding hole 14. Moreover, a reflecting structure 22 is disposed in the light-guide device 20 corresponding to the light guiding hole 14, for reflecting the optical signal, so as to change the traveling path of the optical signal. In this way, the optical signal horizontally traveling in the light-guide device 20 can be reflected by the reflecting structure 22 to be changed in the traveling direction, and thus enter the light guiding hole 14.

The outside of the light-guide device 20 is coated with a joint material 30, for example, a gel sheet or an adhesive glue, for adhering the auxiliary plate 10'. The auxiliary plate 10' is fixed above the lower surface of the plate 10, and thus, the light-guide device 20 is located between the plate 10 and the auxiliary plate 10'. The hybrid electro-optical circuit board 300 further includes one or a plurality of auxiliary light guiding holes 19. The auxiliary light guiding holes 19 are formed by a drilling procedure, and thus penetrate through the plate 10 and the auxiliary plate 10' for transmitting the optical signal between the plate 10 and the auxiliary plate 10'. A metal layer is further formed on the inner wall of each auxiliary light guiding hole 19, and a transparent substance fills the auxiliary light guiding hole 19, to form a traveling path for the optical signal.

Referring to FIGS. 4A to 4E, they show a method for fabricating a hybrid electro-optical circuit board 300.

Figure 4A:
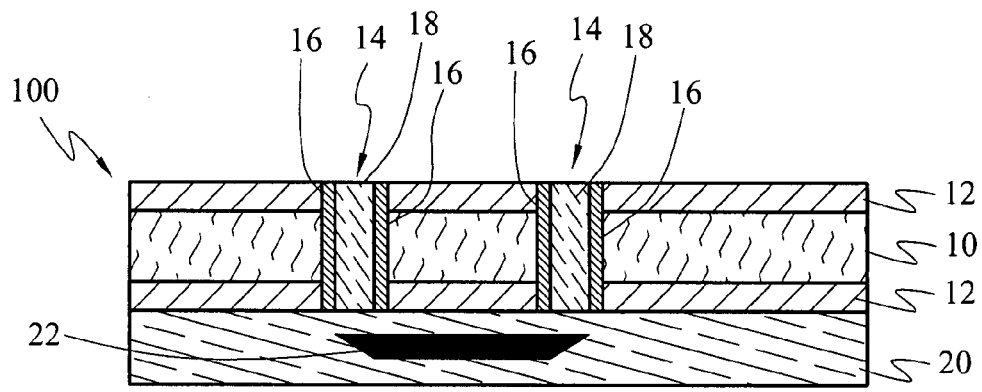
FIGS. 4A, 4B, 4C, 4D, and 4E are schematic flow charts of the fabricating method according to the second embodiment of the present invention.

As shown in FIG. 4A, the fabrication procedure of the second embodiment includes the following steps: fabricating a single hybrid electro-optical circuit board structure, which is the same as that mentioned in the first embodiment, i.e., forming the conductor layer 12 on the plate 10, forming the light guiding hole 14 on the plate 10, forming the metal layer 16 on the inner wall of the light guiding hole 14, and filling the transparent substance 18 into the light guiding hole 14. Sequentially, a light-guide device 20 is formed on the lower surface of the plate 10, and a reflecting structure 22 is formed within the light-guide device 20.

Figure 4B:
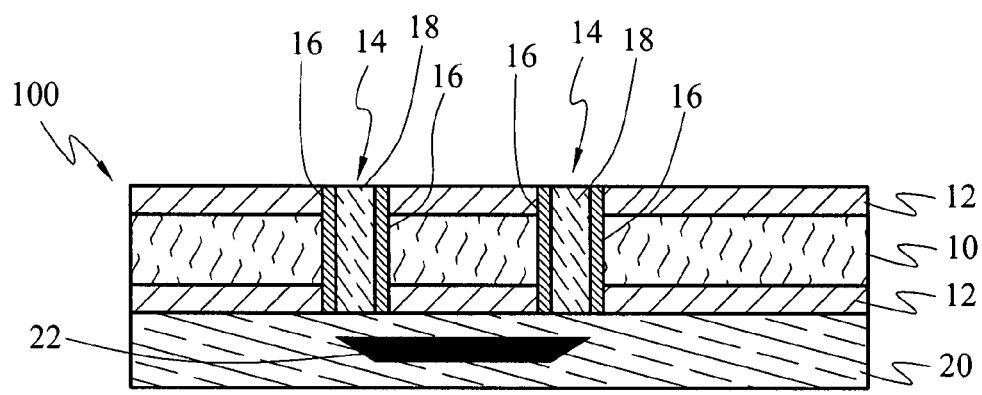
Figure 4B:
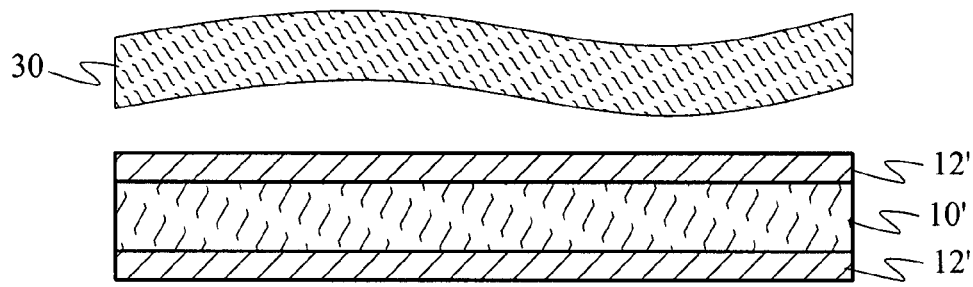

Next, the outside of the light-guide device 20 is coated with a joint material 30 to form the external part of the light-guide device 20, and an auxiliary plate 10' having a conductor layer 12' thereon is placed above the joint material 30, so that the auxiliary plate 10' is fixed above the lower surface of the plate 10, and the light-guide device 20 is located between the plate 10 and the auxiliary plate 10', as shown in FIG. 4B. The above step is not limited to sandwiching the light-guide device 20 between the plate 10 and the auxiliary plate 10', but also can be stacking a plurality of plates 10 or auxiliary plates 10', so as to form a hybrid electro-optical circuit board having multi-layer board structure.

Figure 4C:
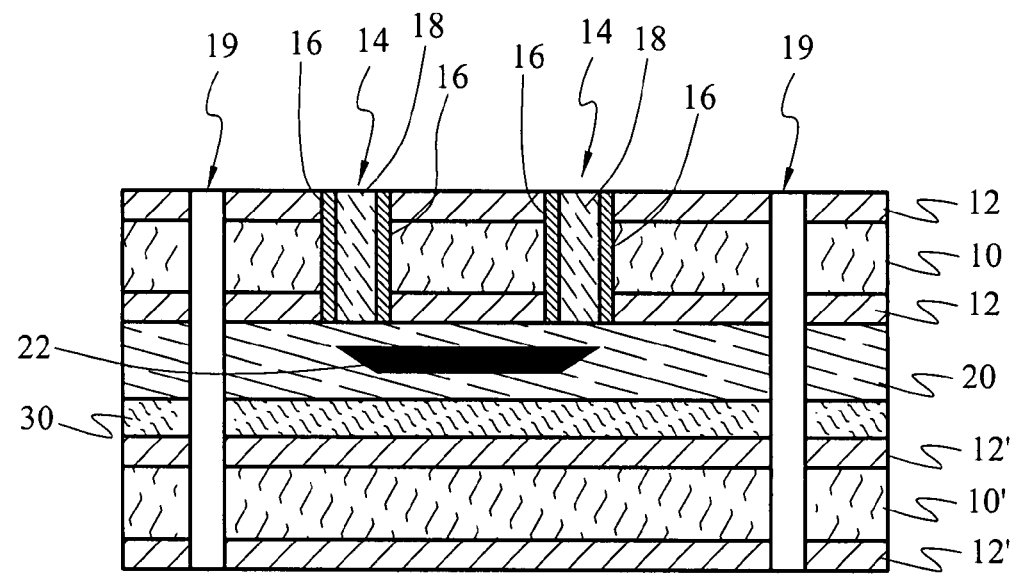

A plurality of auxiliary light guiding holes 19 is formed, so that each auxiliary light guiding hole 19 penetrates through the plate 10 and the auxiliary plate 10', and thus, the optical signal is delivered between the plate 10 and the auxiliary plate 10', as shown in FIG. 4C.

Figure 4D:
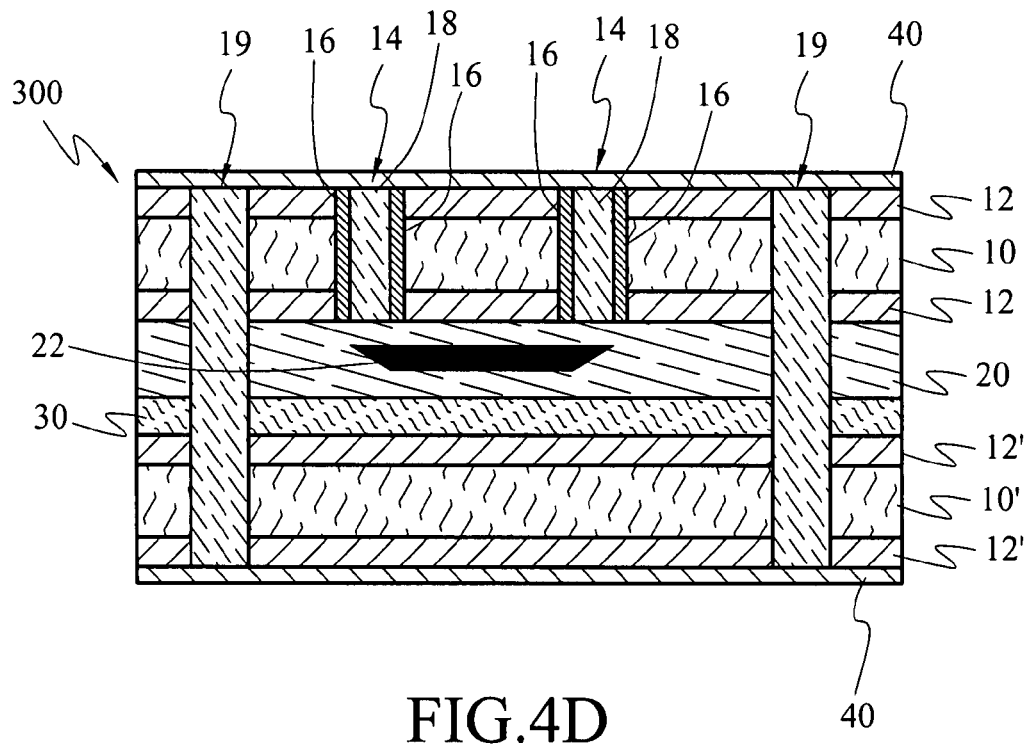

The panel plating process is performed on the upper surface of the plate 10 and the lower surface of the auxiliary plate 10', so that a copper film 40 is plated on the upper surface of the plate 10 and the lower surface of the auxiliary plate 10', as shown in FIG. 4D.

Figure 4E:
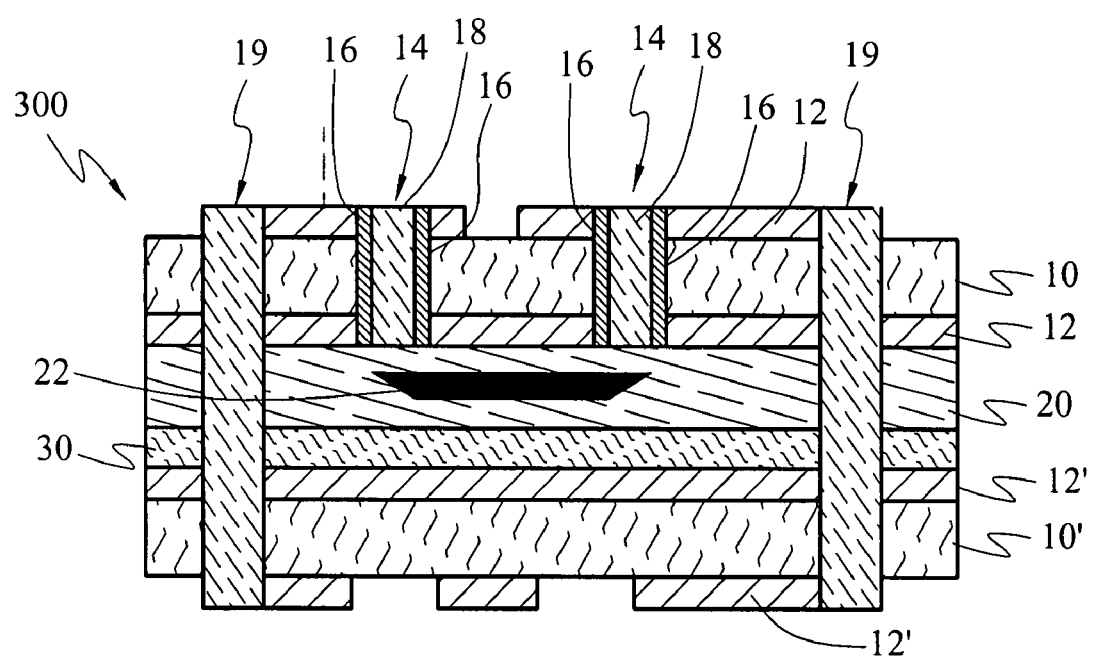

The circuit fabrication procedure, such as wire fabricating, solder mask ink coating, solder mask pattern developing, and tin spraying is performed on the copper film 40, so as to finish such an hybrid electro-optical circuit board 300 having a multi-layer board structure, as shown in FIG. 4E.

In the present invention, the metal layer 16 is mainly plated on the inner wall of the light guiding hole 14, so as to reduce the roughness of the inner wall of the light guiding hole 14, and to reflect an optical signal by utilizing the reflection property of the metal, thereby increasing the optical signal reflectivity, and reducing the attenuation ratio of the optical signal when passing through the light guiding hole 14. Moreover, the transparent substance 18 fills the light guiding hole 14, so that the foreign materials in the process, such as chemical agent and adhesive glue, are prevented from entering the light guiding hole 14 to affect the delivery of the optical signal. Therefore, the reliability of the manufacturing process is effectively enhanced, and the overall light path efficiency of the hybrid electro-optical circuit board is improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A hybrid electro-optical circuit board, comprising:
   a plate having at least one light guiding hole formed therein, the light guiding hole connecting an upper surface and a lower surface of the plate;
   a light-guide device, formed on the lower surface of the plate, the light-guide device directly abutting the lower surface of the plate without a gap, and covering the light guiding hole, for transmitting an optical signal from or to the upper surface of the plate via the light guiding hole;
   an auxiliary plate fixed on the lower surface of the plate, such that the light-guide device is located between the plate and the auxiliary plate; and
   a transparent substance filled into the light guiding hole for transmitting the optical signal.

2. The hybrid electro-optical circuit board as claimed in claim 1, wherein the transparent substance is an anti-chemical corrosion material.

3. The hybrid electro-optical circuit board as claimed in claim 1, wherein the plate includes a conductor layer formed on the upper surface of the plate, for transmitting an electrical signal.

4. The hybrid electro-optical circuit board as claimed in claim 1, wherein the plate includes two conductor layers formed on the upper surface and the lower surface of the plate respectively, for transmitting an electrical signal, and the conductor layer on the lower surface of the plate is located between the plate and the light-guide device.

5. The hybrid electro-optical circuit board as claimed in claim 1, wherein the plate is a printed circuit board or a flexible circuit board.

6. The hybrid electro-optical circuit board as claimed in claim 1, further comprising a metal layer, formed on the inner wall of the light guiding hole, for reducing the roughness of the inner wall of the light guiding hole, and reflecting the optical signal.

7. The hybrid electro-optical circuit board as claimed in claim 6, wherein the material of the metal layer is selected from the group consisting of gold, tin, silver, copper, and aluminum.

8. The hybrid electro-optical circuit board as claimed in claim 1, further comprising an auxiliary light guiding hole which penetrates the plate and the auxiliary plate, for transmitting the optical signal between the plate and the auxiliary plate.

9. A method for fabricating a hybrid electro-optical circuit board, comprising:
   providing a plate;
   forming at least one light guiding hole in the plate, wherein the light guiding hole connects an upper surface and a lower surface of the plate;
   filling the light guiding hole with a transparent substance, for transmitting an optical signal;
   forming a light-guide device on the lower surface of the plate to cover the light guiding hole, the light-guide device directly abutting the lower surface of the plate without a gap, the light-guide device transmitting the optical signal from or to the upper surface of the plate via the light guiding hole; and
   laminating an auxiliary plate on the lower surface of the plate, wherein the light-guide device is located between the plate and the auxiliary plate.

10. The method for fabricating the hybrid electro-optical circuit board as claimed in claim 9, further comprising a step of forming at least one conductor layer on the upper surface of the plate, for delivering an electrical signal.

11. The method for fabricating the hybrid electro-optical circuit board as claimed in claim 9, wherein the transparent substance is an anti-chemical corrosion material.

12. The method for fabricating the hybrid electro-optical circuit board as claimed in claim 10, further comprising a step of forming a metal layer on the inner wall of the light guiding hole, for reducing the roughness of the inner wall of the light guiding hole, and reflecting the optical signal.

13. The method for fabricating the hybrid electro-optical circuit board as claimed in claim 12, wherein the material of the metal layer is selected from the group consisting of gold, tin, silver, copper, and aluminum.

14. The method for fabricating the hybrid electro-optical circuit board as claimed in claim 9, further comprising a step of forming at least one auxiliary light guiding hole that penetrates through the plate and the auxiliary plate, for transmitting the optical signal between the plate and the auxiliary plate.

15. A hybrid electro-optical circuit board, comprising:
   a plate having at least one light guiding hole formed therein, the light guiding hole connecting an upper surface and a lower surface of the plate;
   a light-guide device, formed on the lower surface of the plate, covering the light guiding hole, for transmitting an optical signal from or to the upper surface of the plate via the light guiding hole;

an auxiliary plate fixed on the lower surface of the plate, such that the light-guide device is located between the plate and the auxiliary plate;
a metal layer, formed on the inner wall of the light guiding hole; and
a transparent substance, filled into the light guiding hole for transmitting the optical signal.

16. The hybrid electro-optical circuit board as claimed in claim 15, wherein the material of the metal layer is selected from the group consisting of gold, tin, silver, copper, and aluminum.

* * * * *